| United States Patent [19] | [11] | 4,294,729 |
|---|---|---|
| Bakos et al. | [45] | Oct. 13, 1981 |

[54] COMPOSITION CONTAINING ALCOHOL AND USE THEREOF FOR EPOXY REMOVAL

[75] Inventors: Peter Bakos, Endicott; Russell E. Darrow, Newark Valley; Joseph Funari, Vestal; Richard M. Poliak, Endwell, all of N.Y.

[73] Assignee: International Business Machines Corporation, Armonk, N.Y.

[21] Appl. No.: 104,623

[22] Filed: Dec. 17, 1979

[51] Int. Cl.³ .................. C09D 9/00; C09D 9/04; C11D 3/43; C11D 3/44
[52] U.S. Cl. .................. 252/545; 252/153; 252/170; 252/171; 134/38; 134/42
[58] Field of Search ............. 134/38, 42; 252/DIG. 8, 252/170, 171, 153, 545

[56] References Cited

U.S. PATENT DOCUMENTS

| 2,937,111 | 5/1960 | Leithauser | 252/DIG. 8 X |
| 3,664,962 | 5/1972 | Kelly et al. | 252/170 X |
| 3,775,334 | 11/1973 | Christie | 252/171 |
| 3,954,648 | 5/1976 | Belcak et al. | 134/38 X |

*Primary Examiner*—Dennis L. Albrecht
*Attorney, Agent, or Firm*—Pollock, Vande Sande & Priddy

[57] ABSTRACT

Cured epoxy compositions are removed from substrates by employing compositions containing an organic cyclic alcohol and a surface-active agent.

42 Claims, No Drawings

COMPOSITION CONTAINING ALCOHOL AND USE THEREOF FOR EPOXY REMOVAL

DESCRIPTION

1. Technical Field

The present invention is concerned with providing compositions which are suitable for removing epoxy compositions from a substrate and especially for removing epoxy compositions employed as the backseal for integrated circuit chip modules. Moreover, the present invention is directed to a process for using the removal compositions.

2. Background Art

During the preparation of integrated circuit modules, input/output (I/O) pins are inserted into the substrate of the module. Attached to the backside of the substrate is at least one integrated circuit chip. The input/output pins provide the needed electrical connections to the integrated circuit chips(s) on the backside of the substrate or carrier. The chip carrier or substrate is placed inside a cap or container with the backside of the carrier being covered by the bottom of the cap or container. The backside of the carrier or substrate on which is attached at least one integrated circuit chip is hermetically sealed to the cap or container, such as by employing certain epoxy compositions. The compositions are employed in order to protect and seal the electrically active portions of the module.

In many situations, it is desirable, such as when multiple integrated circuit chips are present on a substrate and/or when multiple substrates are interconnected, such as by stacking, to be able to remove the cap in order to make engineering changes or to replace or repair the semiconductor devices on the carrier. This removal of the cap must be done without destroying the rest of the module so that it can be worked on and reused.

Various arrangements have been suggested for providing removable hermetic caps for integrated circuit modules. Examples of some suggested arrangements can be found in Pottier, "Method of Reworking Sealed Modules", IBM Technical Disclosure Bulletin, Vol. 20, No. 2, July 1977; Hannan et al, "Removable Hermetic Cap", IBM Technical Disclosure Bulletin, Vol. 21, No. 2, July 1978; Pittwood, "Removable Hermetic Seal for Electronic Module Packages", IBM Technical Disclosure Bulletin, Vol. 17, No. 9, February 1975; and Demaine et al, "Cap for Reworkable MC Modules", IBM Technical Disclosure Bulletin, Vol. 21, No. 9, February 1979. The necessity to provide specially configured caps, of course, has several disadvantages in that such requires much greater effort and expense in manufacture.

On the other hand, to provide a composition capable of removing the cured epoxy backseal without adversely affecting the rest of the module requires a delicate balancing of properties. For instance, although certain cyclic alcohols, including benzyl alcohol, which is preferred in the present invention, have been used in certain cleaning compositions, the prior uses suggested therefor do not suggest that such could be employed in compositions capable of removing cured epoxy compositions from a substrate without deleteriously affecting the various other materials referred to hereinabove. For instance, U.S. Pat. No. 3,664,962 to Kelly et al suggests the use of benzyl alcohol in conjunction with a surface active agent in a semisolid stain remover for removing stains from ballpoint pen ink.

U.S. Pat. Nos. 1,820,395 to Lovell et al and 2,281,598 to Prutton suggest removing carbon deposits from a substrate by employing compositions which contain cyclic alcohols, including the preferred benzyl alcohol employed according to the present invention.

U.S. Pat. No. 3,616,803 suggests a composition for removal of dye from hair which is a two-phase liquid system of water and an organic solvent, such as benzyl alcohol, or 2-phenylethanol.

U.S. Pat. No. 4,024,085 to Kobayashi et al suggests various compositions for removing gum from lithographic plates, which compositions can contain some benzyl alcohol.

In addition, there have been some suggestions of compositions for removing paints including epoxies from a substrate. For instance, U.S. Pat. No. 3,410,805 to Goldsmith et al suggests a composition containing a glycol and an N-substituted sulfonamide for improving the paint removing efficiency of alkali metal hydroxide solutions for removing paints such as those based on epoxy resins. U.S. Pat. No. 3,574,123 to Langle suggests stripping compositions which can contain a lower aliphatic alcohol or glycol ether, a surface-active agent, and a phenol. Such composition is suggested as being suitable for removing paints from a substrate, including epoxy paints.

DISCLOSURE OF INVENTION

The present invention makes it possible to remove cured epoxy compositions from a substrate and especially from an integrated circuit module without destroying or adversely affecting the rest of the module. Therefore, the present invention makes it possible to remove the epoxy and, in turn, remove the cap whereby the desired work on the backside of the carrier can be conducted. Accordingly, the present invention makes it possible to save parts of an integrated circuit module and reuse the same. Furthermore, the caps are not adversely affected by the compositions of the present invention, and, accordingly, can also be reused.

The present invention is concerned with a process for removing a cured epoxy composition from a substrate which includes contacting the substrate with a composition which contains a major amount of an organic cyclic alcohol boiling above about 110° C. and a minor amount of a surface active agent. Moreover, the present invention is concerned with removal compositions which contain a major amount of an organic cyclic alcohol boiling above about 110° C. and a minor amount of an ionic fluorocarbon surface active agent. The present invention is also concerned with removal compositions which contain a major amount of an organic cyclic alcohol boiling above about 110° C., a minor amount of another organic solvent boiling above about 110° C., and a minor amount of a surfactant. The other organic solvent is cyclic and/or contains at least one OH group and/or at least one ketone group.

BEST AND VARIOUS MODES FOR CARRYING OUT INVENTION

The liquid organic alcohols employed according to the present invention must be cyclic alcohols and must boil above about 110° C. The cyclic alcohols are cyclohydrocarbyl and include aromatic, cycloaliphatic, and terpene rings. The alcohols preferably boil above about 130° C. and are monohydric. The preferred alcohols are monocyclic and contain five or six carbon atoms in the ring. The rings of the cyclic alcohols can be saturated or partially or completely ethylenically unsaturated. Examples of some suitable alcohols include benzyl alcohol, cyclopentanol, cyclohexanol, diphenylcarbinol (benzhydrol), α-phenylethanol, β-phenylethanol, and terpene alcohols.

The alcohols are present in the compositions in a major amount and preferably are present in amounts at least about 60% by weight, and most preferably at least about 75% by weight of the total composition.

The composition must also contain a surface active agent (i.e. a detergent and/or emulsifier). It has been found that the surface-active agent in combination with the alcohol provides for very quick removal of the epoxy composition. In the absence of the surface-active agent, the alcohols only extremely slowly, if at all, affect removal of the epoxy composition. On the other hand, the surface active agent significantly increases the speed of removal, eventhough the surface active agent in and of itself has no appreciable effect when used alone for removal of the cured epoxy composition.

The surface-active agent can be nonionic, amphoteric, cationic, or preferably, anionic. Mixtures of surface-active agents and different types can be employed if desired. Examples of some nonionic surface-active agents include the alkylene oxide condensation products with higher aliphatic alcohols, alkyl phenols, carboxylic acids, amides, amines, and sulphonamides.

Examples of some ionic surface active agents include higher ($C_8$–$C_{18}$) fatty acid sulfonic acid or salts thereof, such as the sodium, potassium, and ammonium salts thereof. One particular sulfonic acid is the sodium salt of oleic acid sulfonate. Another ionic surfactant has the formula RNHR'COOH wherein R is an aliphatic group having from 8 to 18 carbon atoms and R' is an alkyl group having from 1 to 8 carbon atoms and salts thereof. R is preferably a higher fatty group and R' preferably has from 1 to 4 carbon atoms. Suitable salts include sodium, potassium, and ammonium salts. A particular surfactant of this type is the sodium salt of N-coco betaamine propionate.

Other examples of ionic surface active agents are the alkyl benzene sulfonic acids and alkali metal or ammonium salts thereof. A preferred alkyl benzene sulfonic acid is linear alkyl benzene sulfonic acid having from 8 to 18 carbon atoms in the alkyl group, such as dodecylbenzene sulfonic acid. One preferred ionic surface active agent to employ in the present invention is sodium lauryl sulfate.

The most preferred surface-active agents employed according to the present invention are the fluorocarbon surfactants. A fluorocarbon surface-active agent, as the term is employed according to the present invention, is an organic material that contains the element fluorene and a solubilizing group in its structure. The term "solubilizing group" is used to denote any moiety which would provide the surface-active agent with water solubility and/or oil solubility and ionic (i.e.-anionic or cationic) characteristics. Suitable fluorocarbon surface-active agents for the present invention are described in some detail in U.S. Pat. Nos. 2,803,656; 3,730,782; and 3,734,791.

The ionic fluorocarbon surface active agents suitable for the present invention contain the recurring group ($CF_2$) and can generally be represented by the formula:

$YCF_2(CF_2)_pX$ wherein X is a solubilizing group, as defined hereinbelow, Y is a moiety required to complete the fluorocarbon chain, such as H or F, and p is a positive integer.

The solubilizing portion consists of any group which would have an anionic or cationic character. The term "cationic character" refers to the positive charge carried by the solubilizing group, and the term "anionic character" refers to the negative charge carried by the solubilizing group. The ionic fluorocarbon used in the present invention can thus be viewed as a molecule, one end of which is a solubilizing functional group, preferably anionic, while the other end consists of a fluorocarbon group containing a minimum of four carbon atoms. Generally, representative ionic fluorocarbon surfactants comprise quaternary ammonium fluorocarbon compounds; ammonium fluorocarboxylates; perfluorocarboxylic acids; and fluorocarbonsulfonamidoalkanols, and sulfates or phosphonates of fluorocarbonsulfonamidoalkanols.

One group of fluorocarbon surface-active agents which can be employed according to the present invention are perfluorocarboxylic acids in which the carbon chain of the hydrophobic group is completely fluorinated except for one terminal hydrogen atom. Such surface active agents can be represented by the formula:

$HCF_2(CF_2)_sCOOH$ wherein s preferably is 5 to 8. The salts thereof, such as the metal salts, may also be employed.

The anionic fluorocarbonsulfonamidoalkanol surface-active agents can be represented by the formula:

$R_fSO_2N(R')RCH_2OH$ wherein $R_f$ is a perfluoroalkyl group containing 4 to 12 carbon atoms (which provides the perfluorocarbon "tail"), R is an alkylene bridging group containing 1 to 12 carbon atoms and R' is a hydrogen atom or an alkyl group containing 1 to 6 carbon atoms (methyl, ethyl, propyl, butyl, amyl or hexyl).

The corresponding sulfate-acid esters of these alcohols, which are half-esters of sulfuric acid, have the formula:

$R_fSO_2N(R')RCH_2OSO_3H$

The corresponding sulfate-salt esters, in which the hydrogen atoms of the sulfate acid group is replaced by a metal or ammonium substituent which neutralizes the half-ester to form a "soap" compound, have the formula:

$R_fSO_2N(R')RCH_2OSO_3M$ where M is a metal, such as an alkali metal including sodium and potassium, or ammonium ion.

The corresponding phosphoric acid esters of the above alcohols can be represented by the formula:

$R_fSO_2N(R')RCH_2OP(OH)_2$

In addition, one or both of the hydrogen atoms of the phosphoric acid group can be replaced by a metal such as an alkali metal including sodium and potassium and/or ammonium substituent to form a "soap" compound.

One group of ionic fluorocarbon surface-active agents which can be employed according to the present invention are perfluorocarboxylic acids in which the carbon chain of the hydrophobic group is completely fluorinated. Such surface active agents can be represented by the formula:

$$CF_3[CH_2]_t COOH$$

wherein t is 4 to 11 and preferably is 4 to 8. The salts thereof, such as the metal salts, may also be employed.

The quaternary ammonium cationic fluorocarbon surface active agents can be represented by the formula:

$$C_nF_{2n+1}CONHC_2H_6N(CH_3)_q C_r H_{2r+1} X$$

wherein n is preferably from 6 to 9, q is 2 or 3, and r is 0 to 2. X represents any halide. Two specific examples of materials within the above class are:

$$C_7F_{15}CONHC_2H_6N(CH_3)_2C_2H_5Cl,$$

and $$C_7F_{15}CONHC_2H_6N(CH_3)_2I.$$

Another group of cationic fluorocarbon surface-active agents includes the C-9 and C-11 ammonium fluorocarboxylates having the general formula:

$$H(CF_2)_n COONH_4$$

wherein n equals 8 or 10.

Fluorocarbon surface-active agents are commercially available, for instance, from the 3M Corporation, such as under the trade designations FC-134 and FC-128.

The surfactant identified as FC-134 has the formula:

$$F(CF_2)_7CONHC_3H_6N(C_2H_5)_2CH_3I.$$

To the best of applicants knowledge, the surfactant identified as FC-128 is believed to be represented by one or more of the following:

$$C_5F_{11}COOH, C_9F_{19}COOH,$$

and $$CF_3[CF_2]_7SO_2N[CH_2CH_3]CH_2CH_2OP(OH)_2.$$

The surface-active agent is employed in amounts sufficient to accelerate the removal of the epoxy compositions, which amounts are usually at least about 0.05% by weight of the composition and preferably at least about 0.1% by weight. Normally, amounts of surface-active agents greater than about 15% by weight of the composition are not employed, due mainly to economical and practical considerations. The preferred range of a surface-active agent is from about 0.1 to about 2.5% by weight based upon the total weight of the composition.

In addition to accelerating the removal of the epoxy composition from the substrate, the surface-active agent can also facilitate rinsing of the composition from the substrate, such as with water after use.

In addition to the alcohol and surface-active agent, the compositions of the present invention can also contain an auxiliary organic solvent which boils above about 110° C. Such optional solvents preferably are cyclic compounds, such as cyclohydrocarbyl compounds including aromatic compounds, or cycloaliphatic compounds, and/or contain hydroxyl groups and/or are ketones. Examples of some of these additional organic solvents which can be employed in the compositions of the present invention include cyclohexanone, phenol, xylene, glycerine, catachol, and amine alcohols such as triethanolamine. When employed the organic solvent is usually present in amounts of at least about 5% by weight and up to about 35% and preferably about 10 to about 35% by weight of the total composition.

The substrates which are treated according to the present invention include those substrates commonly used in the preparation of integrated circuit modules or carriers, such as ceramic substrates. A ceramic is a product or material manufactured by the action of heat on earthly raw materials. Preferred ceramic substrates include aluminum oxides, silicon oxides, and silicates, such as aluminum silicate.

The cured or thermoset epoxy compositions which are to be removed from the substrate can be any composition in which the epoxy is the primary bonding agent. Any cured epoxy polymer can be treated according to the present invention, an example of which is a cured epichlorohydrin-bisphenol-A epoxy. The epoxies are generally cured with well-known epoxide curing agents, such as acids and anhydrides. Of course, the epoxy compositions can contain other substituents such as plasticizers, flexibilizers, stabilizers, fillers, pigments and the like. However, since the epoxy is the predominant, and in many cases the sole, bonding agent in the compositions removed according to the present invention, the presence of other ingredients therein does not change the nature of the present invention.

In addition, when the present invention is employed to treat integrated circuit modules, the substrate can include preformed holes through which input/output (I/O) pins can be inserted so as to protrude from one surface of the substrate for insertion to circuit cards or boards. The pins also protrude slightly from the other side referred to as the backside so as to contact the circuitry on the backside which, in turn, connects to the integrated circuit chip or chips mounted on the backside of the substrate. The chip(s) can be mounted, for instance, by well-known solder techniques. The pins of the module can be any of the input/output pins well known in the art and need not be discussed herein in any great detail. Examples of suitable pins are gold plated pins, and tin-lead solder coated pins.

The cap or can into which is placed the substrate is preferably a metal, for example aluminum, and is employed to protect the backside and especially the chip(s) from mechanical damage. The walls of the cap are closely toleranced with the dimensions of the substrate to provide a close fit. Once the chip is placed inside, the can can be crimped and the coating composition is applied which then adheres the substrate hermetically to the sides of the cap to thereby seal the backside from the surrounding environment. The cap or can also includes stand-offs upon which the chip carrier can rest to prevent the chip or chips from contacting physically with the bottom of the inside of the cap.

In addition, prior to inserting the module into the cap or can, the module can be coated on the backside with a topseal coating to protect the backside which contains the integrated circuit chip(s) from corrosion and electromigration. One type of topseal employed is from curing a composition containing as the binder a polyimide polymer. The polyimides are actually cured polymers from what are referred to as polyamides or polyamide-acids containing imide groupings along the polymer chain by condensation of the amide form with an acid group of the polymer chain. Such polymers, as is well known in the art, are prepared by reacting at least one diamine with at least one polycarboxylic acid and/or anhydride thereof and/or ester.

As apparent from the above discussion, the compositions of the present invention must not only be capable of removing the epoxy compositions but must not deleteriously affect a wide variety of other materials which are present in the integrated circuit module, such as the input/output pins, the substrate, the cured polyimide topseal coating, the cap or can, and the chip(s) which are generally obtained from silicon or polycrystalline silicon.

The compositions of the present invention are preferably substantially, if not completely, free from water. The compositions of the present invention usually contain less than about 2% and preferably less than about 0.3% by weight of water. This amount includes the amount of water which might be carried into the composition by one or more of the required components of the composition due to their hydroscopic nature. The presence of water is undesirable when treating ceramic substrates, since at the normal operating temperatures employed in the present invention it vaporizes and can then become entrapped within pores of the substrate. This, in turn, presents corrosion and reliability problems.

The compositions of the present invention are liquid at the operating temperatures employed and preferably are liquid at normal room temperatures and have viscosities no greater than about 5 centistokes.

The compositions of the present invention are generally employed at elevated temperatures, such as from about 100° to about 200° C., and preferably from about 120° to about 200° C. Use of low temperatures, such as ambient, is not effective for removing epoxy compositions. The time of contact to remove the compositions will depend somewhat upon the thickness of the coating to be removed and the particular removal composition employed. For instance, a coating of about 100 mils thick generally requires from about 3 to about 4 hours for removal at the above-defined elevated temperatures, whereas a coating of about 5 mils thick requires from about 5 to about 30 minutes removal at the above-defined elevated temperatures.

In addition, the contact with the removal composition is preferably carried out with vigorous agitation. This can be accomplished, for instance, by rapid stirring with a metal blade (e.g.-about 100-2500 rpm) of the composition in a tank into which are dipped the substrates to be treated. The agitation can also be accomplished by spraying the composition onto the substrate at a pressure, for instance, of about 2 to about 300 psi. After contact with the solvent composition, the substrates can be rinsed with solvents compatible with the compositions. Also, if desired the substrates can be dried, such as by blowing with hot or cold air. A typical rinsing procedure involves contacting the substrates with N-methyl pyrrolidone at normal room temperatures for about 1-2 minutes, followed by a tap water rinse for about 30-35 seconds, and then a deionized water rinse for about 15-60 seconds.

Although the above discussion is mainly concerned with the treatment of integrated circuit modules, it is understood that the present invention is applicable to treating substrates in general which necessitate the removal of epoxy compositions from the substrates.

The following non-limiting examples are provided to further illustrate the present invention.

EXAMPLE 1

About 100 parts by weight of benzyl alcohol and about 1 part by weight of FC-128 are admixed to provide a removal composition. Into a vessel containing the composition at about 145° C. are dipped a plurality of ceramic integrated circuit modules having input/output pins protruding therefrom and backsealed to an aluminum cap. The modules have on the backside thereof a polycrystalline silicon chip and a topseal of cured polyimide composition. The ceramic substrate is hermetically sealed to the aluminum cap with a cured epoxide composition. The ceramic substrate is an $Al_2O_3$ substrate having thereon chrome and copper metallurgy. Some of the modules have gold-coated input/output pins; others have tin-lead solder coated pins, and others have copper pins.

The cured epoxide composition is from the curing of a composition containing about 47.6% by weight of a bisphenol-a epichlorohydrin epoxy polymer, about 52% by weight of a flexibilizer and hardener portion obtained from the 3M Company which contains about 15 to about 49% by weight of hexahydrophthalic anhydride hardener, about 40 to 85% by weight of a polyoxypropylene glycol, 0.85% to 1% by weight of a tertiary amine, and minor amounts of hexahydrophthalic acid resulting from the hydrolysis of the hexahydrophthalic anhydride; and about 2% by weight of a green coloring agent portion available under the trade designation Hysol, about 80% of which is Epon 828 and about 20% of which is chlorinated copper phthalocyanine dye on a titanium dioxide pigment carrier.

The epoxy polymer is a diglycidlyether of bisphenol-A and epichlorohydrin having a epoxy equivalent weight of 185 to 192 and a viscosity at 25° C. of 10,000 to 15,000 centipoise available under the trade designation Epon 828. The coating thickness is about 35 mils. The coating is cured by heating at about 100° C. for about 4 hours followed by heating at about 150° C. for another 4 hours.

All of the epoxy composition is removed from the substrates in about 45 minutes to about 60 minutes. In addition, repeating the above procedure with vigorous agitation of about 300 to about 400 rpm results in removal of all of the epoxy in about 20 to about 40 minutes.

In addition, the modules are rinsed by contacting with N-methyl pyrrolidone at room temperature for about 1 minute, followed by contacting with water at room temperature for about 30-35 seconds, and then by contacting with deionized water at room temperature for about 15-60 seconds.

EXAMPLE 2

The general procedure of Example 1 is repeated, except that the composition employed contains about 80% by weight of benzyl alcohol, about 19% by weight of phenol, and about 1% by weight of FC-128. When the composition is employed at temperatures of about 175° C. with vigorous agitation of about 300-400 rpm, the cured epoxy composition is removed from the substrate in about 3 hours with a slight amount of epoxy remaining. Separation of the cap from the module was readily achieved.

EXAMPLE 3

Part A

The general procedure of Example 1 is repeated, except that the composition contains about 66 parts by weight of benzyl alcohol, about 33 parts by weight of phenol, and about 1 part by weight of FC 128.

The modules are immersed into the composition for 120 hours at ambient temperature. However, although the epoxy backseal was somewhat softened due to contact with the composition, the cap did not separate from the substrate. In addition, the same contact is carried out with rapid agitation of 300–400 rpm results in only partial removal of epoxy during 120 hours of contact time.

Part B

Part A above is repeated, except that the removal composition is heated to about 100° C. and vigorously agitated at about 300–400 rpm. The above types of modules are immersed in the composition. The epoxy backseal is removed therefrom in about 4 to 5 hours with some slight amounts of epoxy remaining. The substrates are readily separated from the caps.

Part C

Part A is repeated, except that the composition is heated to about 150° C. Modules of the type discussed above were immersed therein with vigorous agitation. The epoxy is removed in about two hours with some slight amounts of epoxy remaining. The substrates are readily removed from the caps.

Part D

Part A is repeated, except that the above composition is heated to about 170° C. Modules of the type discussed above are immersed therein with vigorous agitation. The epoxy composition is removed in about 1½ hours with slight amounts remaining. Raising the temperature to about 200° C. did not decrease the removal time.

EXAMPLE 4

The general procedure of Example 1 is repeated, except that the removal composition contains about 66% by weight of benzyl alochol, about 32% by weight of phenol, and about 2% by weight of FC-128. The removal time requirements for the composition of this example were about the same as those of Example 3. However, no residue from the epoxy composition remained on the modules.

EXAMPLE 5

The general procedure of Example 1 is repeated, except that the composition employed contains about 85% by weight of benzoyl alcohol, about 14% by weight of triethanol amine, and about 1% by weight of FC-128, and the composition is employed at about 150° C. All of the epoxy is removed from the substrates in about 1 hour with vigorous agitation of about 300–400 rpm.

EXAMPLE 6

The general procedure of Example 1 is repeated, except that the composition contains about 85% by weight of benzyl alcohol, about 14% by weight of cyclohexanone, and about 1% by weight of FC-128. All of the epoxy is removed in about 1 hour at temperatures of about 150° C. and vigorous agitation of about 300–400 rpm.

EXAMPLE 7

The general procedure of Example 1 is repeated, except that the removal composition contains about 91.9% by weight of benzyl alcohol, about 8% by weight of triethanolamine, and about 0.1% by weight of FC-128. The composition removes all of the epoxy composition in about 1 hour when employed at temperatures of about 150° C. with vigorous agitation of about 300–400 rpm.

All of the above compositions adequately remove the cured epoxy from the substrates without deleteriously affecting the other constituents of the electronic integrated circuit modules.

It was quite unexpected that the cyclic alcohols contemplated for the present invention provide satisfactory results. A number of other types of alcohols were tested but did not effectively remove the cured epoxy from the substrates. Other alcohol compositions tried but which were unsuccessful include those containing crotyl alcohol, glycols, propyl alcohol, butyl alcohol and n-amyl alcohol. It is noted, however, that one module tested with the amyl alcohol compositions containing a surfactant had about one-half of the epoxy removed, but all of the other modules had none or hardly any epoxy removed. However, none of the alcohol compositions other than those contemplated by the present invention were sufficiently effective for removing cured epoxy that such could be employed for dismantling integrated circuit modules without causing damage to any of the other parts of the module. In addition, compositions of the present invention do not chemically attack such refractory metals as tin, copper, lead and aluminum.

What is claimed is:

1. A removal composition capable of removing a cured epoxy polymer from a substrate consisting essentially of at least about 75% by weight based upon the weight of the composition of an organic cyclohydrocarbyl alcohol boiling above about 110° C., wherein said hydrocarbyl is selected from the group of aromatic ring, cycloaliphatic ring or terpene ring, and a minor amount of an ionic fluorocarbon surface agent.

2. The removal composition of claim 1 wherein said alcohol boils about 130° C. and is a monohydric alcohol.

3. The removal composition of claim 1 wherein said alcohol is monocyclic and contains 5 or 6 carbon atoms in the ring.

4. The removal composition of claim 1 wherein said alcohol is monocyclic, monohydric, contains 5 or 6 carbon atoms in the ring, and boils above about 130° C.

5. The removal composition of claim 1 wherein said alcohol is selected from the group of benzyl alcohol, cyclopentanol, cyclohexanol, diphenylcarbinol, α-phenylethanol, β-phenylethanol, terpene alcohol, and mixtures thereof.

6. The removal composition of claim 1 wherein said alcohol is benzyl alcohol.

7. The composition of claim 1 wherein said fluorocarbon surfactant is anionic.

8. The composition of claim 7 wherein said fluorocarbon surfactant is a perfluorocarboxylic acid, a fluorocarbonsulfonamidoalkanol, a sulfate thereof, a phosphonate thereof, or mixtures thereof.

9. The removal composition of claim 1 wherein said fluorocarbon surface-active agent is at least one compound represented by one of the following formulas:

(A) $R_fSO_2N(R')RCH_2OH$;
(B) $R_fSO_2N(R')RCH_2OSO_3H$;
(C) $R_fSO_2N(R')RCH_2OSO_3M$;
(D) $R_fSO_2N(R')RCH_2OP(OH)_2$ or metal salts thereof or ammonium salts thereof; and
(E) $CF_3[CF_2]_tCOOH$;

wherein $R_f$ is a perfluoroalkyl group containing 4 to 12 carbon atoms; R is a alkylene bridging group containing 1 to 12 carbon atoms; R' is hydrogen or an alkyl group containing 1 to 6 carbon atoms; M is a metal or ammonium; and t is an integer of 4 to 11.

10. The composition of claim 1 wherein the surface-active agent is one or more of the following:
(A) $C_5F_{11}COOH$;
(B) $C_9F_{19}COOH$; and
(C) $CF_3[CH_2]_7SO_2N[CH_2CH_3]CH_2CH_2OP[OH]_2$.

11. The composition of claim 1 wherein the surface-active agent is present in an amount of at least about 0.05% by weight of the composition.

12. The composition of claim 1 wherein the surface-active agent is present in an amount of at least 0.1% by weight.

13. The composition of claim 1 wherein the surface-active agent is present in an amount of about 15% by weight or less.

14. The composition of claim 1 wherein the surface-active agent is present in an amount of about 0.1 to about 2.5% by weight based upon the total weight of the composition.

15. The removal composition of claim 1, 5, 6, 8, 9 or 10 which contains a minor amount of an organic solvent which is at least one of a cyclocompound, or contains a hydroxyl group, or contains a keto group.

16. The composition of claim 15 wherein said organic solvent is selected from the group of cyclohexanone, phenol, xylene, glycerine, catechol, and amine alcohols.

17. The composition of claim 15 wherein said organic solvent is triethanolamine.

18. The composition of claim 15 wherein said organic solvent is cyclohexanone.

19. A removal composition capable of removing a cured epoxy polymer from a substrate consisting essentially of at least about 75% by weight based upon the weight of the composition of an organic cyclohydrocarbyl alcohol boiling above about 110° C., wherein said hydrocarbyl is selected from the group of aromatic ring, cycloaliphatic ring or terpene ring, a minor amount of an organic solvent boiling above about 110° C., and a minor amount of a surface active agent, wherein said organic solvent is at least one of a cyclocompound, or contains a hydroxyl group, or contains a keto group.

20. The composition of claim 19 wherein said organic solvent is selected from the group of cyclohexanone, phenol, xylene, glycerine, catechol, and amine alcohols.

21. The composition of claim 19 wherein said organic solvent is triethanolamine.

22. The composition of claim 19 wherein said organic solvent is cyclohexanone.

23. The composition of claim 19 wherein the organic solvent is present in an amount of at least 5% by weight, and said surface active agent is present in an amount of at least 0.05% by weight based upon the total weight of the composition.

24. The composition of claim 19 wherein said alcohol is benzyl alcohol.

25. A process for removing a cured epoxy composition from a substrate which comprises contacting the substrate containing said epoxy composition to be removed with a removal composition consisting essentially of at least about 75% by weight based upon the weight of the composition of an organic cyclohydrocarbyl alcohol boiling above about 110° C., wherein said hydrocarbyl is selected from the group of aromatic ring, cycloaliphatic ring or terpene ring, and a minor amount of a surface active agent.

26. The process of claim 25 wherein said substrate is a ceramic substrate.

27. The process of claim 26 wherein said ceramic substrate is an integrated circuit module.

28. A process for removing a cured epoxy composition from a ceramic substrate which comprises contacting the substrate containing said epoxy composition to be removed with a composition containing a major amount of an organic cyclohydrocarbyl alcohol boiling above about 110° C., wherein said cyclohydrocarbyl is selected from the group of aromatic ring, cycloaliphatic ring, or terpene ring, and a minor amount of a surface active agent.

29. The process of claim 28 wherein said ceramic substrate is an integrated circuit module.

30. The process of claim 25, 28 or 29 wherein said alcohol is selected from the group of benzyl alcohol, cyclopentanol, cyclohexanol, diphenylcarbinal, α-phenylethanol, β-phenylethanol, terpene alcohol, and mixtures thereof.

31. The process of claim 25, 28 or 29 wherein said alcohol is benzyl alcohol.

32. The process of claim 25, 28 or 29 wherein said surface-active agent is an ionic fluorocarbon surface-active agent.

33. The process of claim 32 wherein said fluorocarbon surfactant is anionic.

34. The process of claim 33 wherein said fluorocarbon surfactant is a perfluorocarboxylic acid, a fluorocarbonsulfonamidoalkanol, a sulfate thereof, a phosphonate thereof, or mixtures thereof.

35. The process of claim 32 wherein said fluorocarbon surface-active agent is at least one compound represented by one of the following formulas:
(A) $R_fSO_2N(R')RCH_2OH$;
(B) $R_fSO_2N(R')RCH_2OSO_3H$;
(C) $R_fSO_2N(R')RCH_2OSO_3M$;
(D) $R_fSO_2N(R')RCH_2OP(OH)_2$ or metal salts thereof of ammonium salts thereof; and
(E) $CF_3[CF_2]_tCOOH$;

wherein $R_f$ is a perfluoroalkyl group containing 4 to 12 carbon atoms; R is an alkylene bridging group containing 1 to 12 carbon atoms; R' is hydrogen or an alkyl group containing 1 to 6 carbon atoms; M is a metal or ammonium; and t is an integer of 4 to 11.

36. The process of claim 32 wherein the surface-active agent is one or more of the following:
(A) $C_5F_{11}COOH$;
(B) $C_9F_{19}COOH$; and
(C) $CF_3[CF_2]_7SO_2N[CH_2CH_3]CH_2CH_2OP[OH]_2$.

37. The process of claim 25, 28 or 29 wherein the surface-active agent is present in an amount of about 0.1 to about 2.5% by weight based upon the total weight of the composition.

38. The process of claim 25, 28 or 29 wherein said removal composition contains a minor amount of an organic solvent boiling above about 110° C. which is at least one of a cyclocompound or contains a hydroxyl group or contains a keto group.

39. The process of claim 38 wherein said organic solvent is selected from the group of cyclohexanone, phenol, xylene, glycerine, catechol, and amine alcohols.

40. The process of claim 38 wherein said organic solvent is triethanolamine.

41. The process of claim 38 wherein said organic solvent is cyclohexanone.

42. The process of claim 32, 33, 34, 35, 36, 26 or 27 wherein said alcohol is benzyl alcohol.

* * * * *